(12) United States Patent
McEwen et al.

(10) Patent No.: US 6,446,236 B1
(45) Date of Patent: Sep. 3, 2002

(54) READING ENCODED INFORMATION SUBJECT TO RANDOM AND TRANSIENT ERRORS

(75) Inventors: Peter McEwen, Santa Clara; Hossein Sedarat, Stanford, both of CA (US); Kelly Fitzpatrick, Sudbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/418,191

(22) Filed: Oct. 13, 1999

(51) Int. Cl.[7] .................... H03M 13/03; H04L 23/02
(52) U.S. Cl. .............. 714/795; 714/763; 714/792; 714/796; 375/262; 375/265; 375/341; 360/53
(58) Field of Search ............... 714/795, 5, 55, 714/765, 787, 788, 789, 792, 796, 763, 764, 769; 375/261, 262, 265, 269, 263, 290, 316, 341, 348; 360/48, 53, 55, 65, 67, 73.03, 75, 77.08, 327

(56) References Cited

U.S. PATENT DOCUMENTS

| | | | |
|---|---|---|---|
| 4,745,625 A | * 5/1988 | Eyuboglu | 375/316 |
| 5,341,387 A | 8/1994 | Nguyen | 714/788 |
| 5,521,945 A | 5/1996 | Knudson | 375/341 |
| 5,661,760 A | 8/1997 | Patapoutian et al. | 375/341 |
| 5,701,314 A | 12/1997 | Armstrong et al. | 714/765 |
| 5,751,510 A | 5/1998 | Smith et al. | 360/67 |
| 5,754,355 A | 5/1998 | Nakamura et al. | 360/73.03 |
| 5,793,576 A | 8/1998 | Gill | 360/327 |
| 5,812,752 A | 9/1998 | Yamada | 714/5 |
| 5,818,656 A | 10/1998 | Klaassen et al. | 360/67 |
| 6,101,227 A | * 8/2000 | Glover | 375/341 |
| 6,134,065 A | * 10/2000 | Bergmans et al. | 360/53 |

* cited by examiner

Primary Examiner—Emmanuel L. Moise
(74) Attorney, Agent, or Firm—Fish & Richardson P C (57) ABSTRACT

A scheme (apparatus and methods) for recovering encoded data from a data signal representing one or more data symbols and subject to random errors and transient errors. A system in accordance with this scheme includes a transient error detector, a reliability detector, an erasure flagger, and a decoder. The transient error detector is coupled to receive the data signal and is configured to identify one or more characteristics (e.g., a starting location and a midpoint location) of a transient error (e.g., a TA) in the data signal. The reliability detector is configured to compute a reliability metric for each data symbol. The erasure flagger identifies erasures based upon signals received from the transient error detector and the reliability detector. The decoder is configured to treat a data symbol as an erasure or as a valid data symbol based upon the output of the erasure flagger.

26 Claims, 5 Drawing Sheets

READING ENCODED INFORMATION SUBJECT TO RANDOM AND TRANSIENT ERRORS

BACKGROUND OF THE INVENTION

The application relates to systems and methods for reading encoded information subject to random errors and transient errors.

Various error correction encoding techniques typically are used in digital communication systems (e.g., a system for reading information from a storage medium, such as an optical disk) to increase the rate at which information may be transferred to and from the storage medium and to reduce the rate at which errors occur. Many error correction techniques involve the use of an error correction code (e.g., a Reed Solomon code with 8 bit data symbols) to encode the information and to pad the information with redundancy (or check) symbols which are used to correct improperly read data symbols. Errors (data symbols with incorrect values and unknown locations) and erasures (data symbols with unreliable values but known locations) are identified and corrected by an error correction code (ECC) decoder. The ECC decoder may correctly decode a block of data when the error-correction capacity of the code is greater than the sum of twice the number of errors and the number of erasures. Typically, an additional cross-check code is used to detect when the ECC decoder has failed to properly decode a data block. If the cross-check passes, the corrected data symbols are transmitted back to the host computer. If the ECC fails, however, the data block must be reread, increasing the time required to access the data on the storage medium. The ECC decoder may correct twice as many erasures as errors; thus, the ECC decoder failure rate may be reduced by erasing data symbols that are corrupted, e.g., by a transient error. Ideally, the ECC decoder should erase corrupted data symbols without producing too many false erasures (data symbols with correct values that have been erased).

The process of reading digital information stored on a storage medium introduces into the resulting data signal random noise and transient errors (e.g., errors due to sources other than the random noise sources assumed by the data detector). Signals produced in the read channels of magnetic recording systems (e.g., magnetic disk drives) that use magnetoresistive (MR) heads are subject to thermally-induced transient errors (e.g., thermal asperities). A thermal asperity (TA) may be induced when a MR head collides with contamination or some other raised feature on the surface of a magnetic storage disk. The collision causes the temperature, and consequently the resistance, of the MR element to increase. The change in resistance produces a voltage transient at the output of the MR element. The magnitude of the transient may be large relative to the magnitude of the data signal, and the duration of the transient may be long relative to the bit-time. As a result, thermal asperities may introduce a large number of errors into the read channel. In fact, the number of errors may be too large for the ECC decoder to correct. The inability to efficiently handle transient errors, such as thermal asperities, decreases the overall performance and reliability of the system.

Transient error detectors have been used to detect the beginning and end (or midpoint) of a transient error and to label consecutive symbols in a data signal as erasures. On a tape drive, e.g., a drop-out detector may be used to detect the beginning of a drop-out when the envelope of a data signal amplitude drops below a threshold and to detect the end of a drop out when the data signal envelope recovers. (See, e.g., "Comparative Performance Between Drop-Out Detection and Viterbi Reliability Metric Erasure Flagging," William Ryan, Ampex Corp., Intermag '92 Conference Digest, GA-Apr. 5, 1992.) In a magnetic disk drive with MR heads, a thermal asperity detector may define the beginning of a TA when the magnitude of the low-pass-filtered signal exceeds a threshold and may define the midpoint of the TA when the low-pass-filtered signal first crosses zero after the identified beginning of the TA.

In a sampled data detection system subject only to random errors (not transient errors), a different erasure labeling system has been proposed. In this system, a detector produces erasures whenever data samples are too close to a decision boundary. For each data symbol, a reliability metric usually is computed based upon the minimum decision margin (i.e., the distance between the data sample and the decision boundary is the decision margin) for a decision affecting the bits in that data symbol. When there is zero margin, the data symbol has an error probability of one-half; as the decision margin increases, the error probability decreases. In one approach, data is detected using a soft-output Viterbi detector and the decision margin (a Viterbi difference metric in this approach) at a particular time corresponds to the magnitude of the difference between the path metric for the best path and the path metric for the path that was rejected when it re-merged with the best path at that time. (See, e.g., "A Viterbi Algorithm with Soft-Decision Outputs and Its Applications," J. Hagenauer and P. Hoeher, Proc. Of IEEE GLOBECOME '89 Conference, Dallas, Tex., November 1989, pp. 1680–1686.)

SUMMARY OF THE INVENTION

The invention relates to a scheme for recovering encoded data from a data signal representing one or more data symbols and subject to random errors and transient errors. The invention features a system that includes a transient error detector, a reliability detector, an erasure flagger, and a decoder. The transient error detector is coupled to receive the data signal and is configured to identify one or more characteristics (e.g., a starting location and a midpoint location) of a transient error (e.g., a TA) in the data signal. The reliability detector is configured to compute a reliability metric for each data symbol. The erasure flagger identifies erasures based upon signals received from the transient error detector and the reliability detector. The decoder is configured to treat a data symbol as an erasure or as a valid data symbol based upon the output of the erasure flagger.

In another aspect, the invention features a magnetic disk storage system that includes, in addition to the features of the above-described system, at least one magnetic storage disk, and at least one magnetoresistive (MR) head configured to extract an encoded data signal from at least one magnetic storage disk.

Embodiments may include one or more of the following features.

In one embodiment, a first erasure period beginning at the start of the data block and ending at an identified transient error starting location is defined, a second erasure period beginning at the end of the first erasure period and ending a preselected number of data symbols after an identified midpoint location is defined, and a third erasure period beginning at the end of the second erasure period is defined. The third erasure period may end when a second transient error is detected. Each data symbol within the first erasure period may be labeled as a valid data symbol; each data symbol within the second erasure period may be labeled as an erasure; and each data symbol within the third erasure period may be labeled as an erasure or as a valid data symbol based upon a comparison of the computed reliability metric against the minimum reliability threshold. Alternatively, each data symbol within the first erasure period may be labeled as an erasure or as a valid data symbol based upon a comparison of a first computed reliability metric against a first minimum reliability threshold, and each data symbol within the second erasure period may be labeled as an erasure or as a valid data symbol based upon a comparison of a second computed reliability metric (which is different from the first reliability metric) against a second minimum reliability threshold. Similarly, the third erasure period may use a third reliability metric and corresponding threshold. The third computed reliability metric may differ from the first and second reliability metrics. For example, the first reliability metric may be computed based upon an additive white Gaussian noise model, and the second or third reliability metric may be computed based upon the same noise model but with a different mean and variance.

The erasure flagger may label one or more data symbols as erasures by OR-ing together erasure information generated by both the transient error detector and the reliability detector.

The computed reliability metric may be based upon a Viterbi difference metric. A data symbol may be labeled as an erasure when the computed Viterbi difference metric is less than the minimum reliability threshold for any time associated with the data symbol. Alternatively, the computed reliability metric may be the increase in a Viterbi path metric along the best path over the data symbol (e.g., the Viterbi path metric for the best path ending at a time coincident with the end of the data symbol minus the Viterbi path metric for the best path ending at a time coincident with the start of the data symbol). A data symbol may be labeled as an erasure when the Viterbi path metric exceeds the minimum reliability threshold.

Among the advantages of the invention are the following. The invention reduces the impact of transient errors, such as thermal asperities, on ECC failure rate by using all the information from the transient detector and the reliability detector. By improving the ability of the system to correctly identify erasures in a data signal subject to transient errors, the invention enables the decoder to correct a greater number of errors in the data signal.

Other features and advantages will become apparent from the following description, including the drawings and the claims.

DESCRIPTION OF THE PREFERRED EMBODIMENTS

Figure 1:
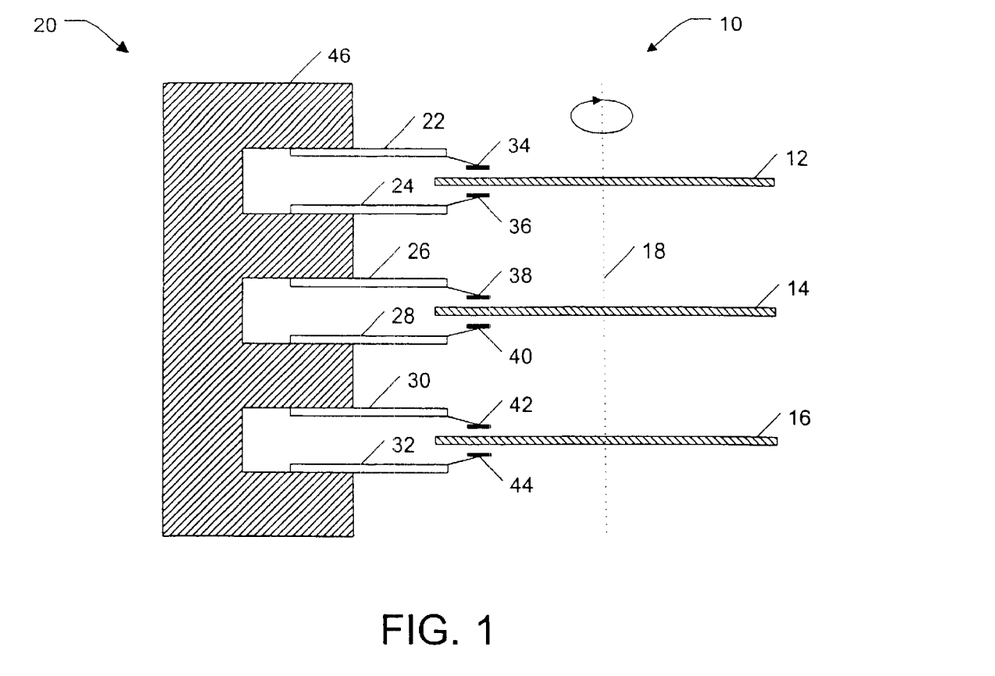
FIG. 1 is a diagrammatic side view of a magnetic storage drive system, including an actuator assembly, a plurality of head support assemblies each coupled to a respective MR head, and a plurality of magnetic storage disks.

Referring to FIG. 1, a magnetic disk storage system 10 includes a plurality of magnetic storage disks 12, 14 and 16, each of which is configured to rotate about an axis 18, and a head stack assembly 20 that includes a plurality of head support assemblies 22, 24, 26, 28, 30 and 32, each of which is coupled by a gimbal mechanism to a respective slider 34, 36, 38, 40, 42 and 44. Each slider 34–44 supports one or more magnetic read/write transducers (MR heads) that may read data from and write data to magnetic storage disks 12–16. Each magnetic storage disk 12–16 stores information in magnetic recording media supported on each disk; the information is stored in an annular pattern of concentric data tracks. As a disk rotates, data stored at different locations on the disk may be accessed by moving a slider to the appropriate locations on the surface of the disk. Slider movement is controlled by an actuator assembly 46 which controls the positions of head support assemblies 22–32. Head support assemblies 22–32 are configured to bias sliders 34–44 against the surfaces of disks 12–16. The rotation of disks 12–16 produces air bearings between sliders 34–44 and the surfaces of disks 12–16; the air bearings lift sliders 34–44 above the surfaces of disks 12–16 by a small, substantially constant distance.

As explained above, the process of reading information from storage disks 12–16 is subject to interference, including random noise and transient errors. To reduce the significance of these errors, information is encoded onto storage disks 12–16 using known error correction code techniques which enable a decoder to correct some or all of the errors introduced into the read channel. Certain errors (e.g., thermal asperities), however, may introduce a significant number of errors into the read channel. If the number of errors in a data signal read from a storage disk exceeds the error correction capability of the decoder, the read channel must wait for the storage disk to make another revolution and repeat the read process. Multiple read attempts are undesirable because each additional read attempt increases the overall access time of the storage system. As explained in detail below, the invention reduces the impact of transient errors, such as thermal asperities, by computing a reliability metric which may be used to identify erasures in the data signal read from a storage disk. By improving the ability of the system to correctly identify erasures in the data signal, the invention enables the decoder to correct a greater number of errors in the data signal.

Basic Read Channel Configuration

Figure 2:
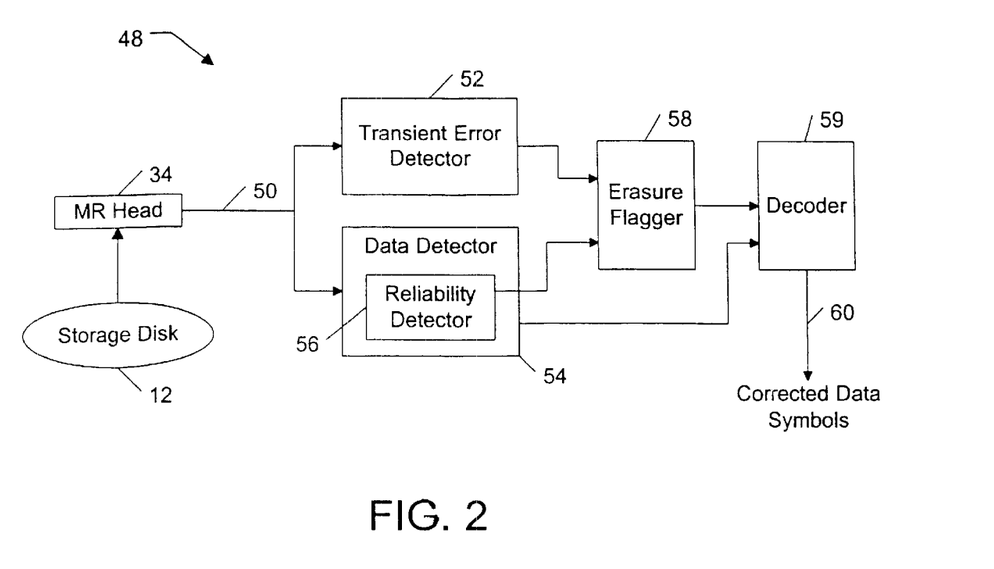
FIG. 2 is a block diagram of a read channel of the magnetic storage drive system of FIG. 1.

Referring to FIG. 2, in one embodiment of a read channel 48, MR head 34 generates a data signal 50 as a result of resistance changes in the MR element caused by localized magnetic transitions stored on magnetic storage disk 12. MR head 34 transmits data signal 50 to a transient error detector 52 and a data detector 54. Transient error detector 52 analyzes data signal 50 and identifies one or more characteristics (e.g., a starting location and a midpoint location) of a transient error (e.g., a TA) in data signal 50. Data detector 54 extracts data symbols from data signal 50. Data detector 54 includes a reliability detector 56 which computes a reliability metric for each data symbol. Data detector 54 also may include an EPR4 post-processor as described in, e.g., Knudson, U.S. Pat. No. 5,521,954, which is incorporated herein by reference. Transient error location information from transient error detector 52, as well as extracted data symbols and reliability metric information from data detector 54, are transmitted to an erasure flagger 58. Erasure flagger 58 identifies erasures based, at least in part, upon a comparison of one or more of the reliability metrics against one or more corresponding minimum reliability thresholds. After the erasures have been identified, a decoder 59 corrects errors and erasures in data signal 50 and generates a sequence of corrected data symbols 60 from the data symbols received from data detector 54.

A detailed description of the components of read channel 48 follows with reference to FIGS. 2 . 5.

Transient Error Detector

Transient error detector 52 may be implemented using various transient error detection techniques. Two different transient error detector embodiments are described below.

ANALOG TRANSIENT DETECTOR CONFIGURATION

Figure 3:
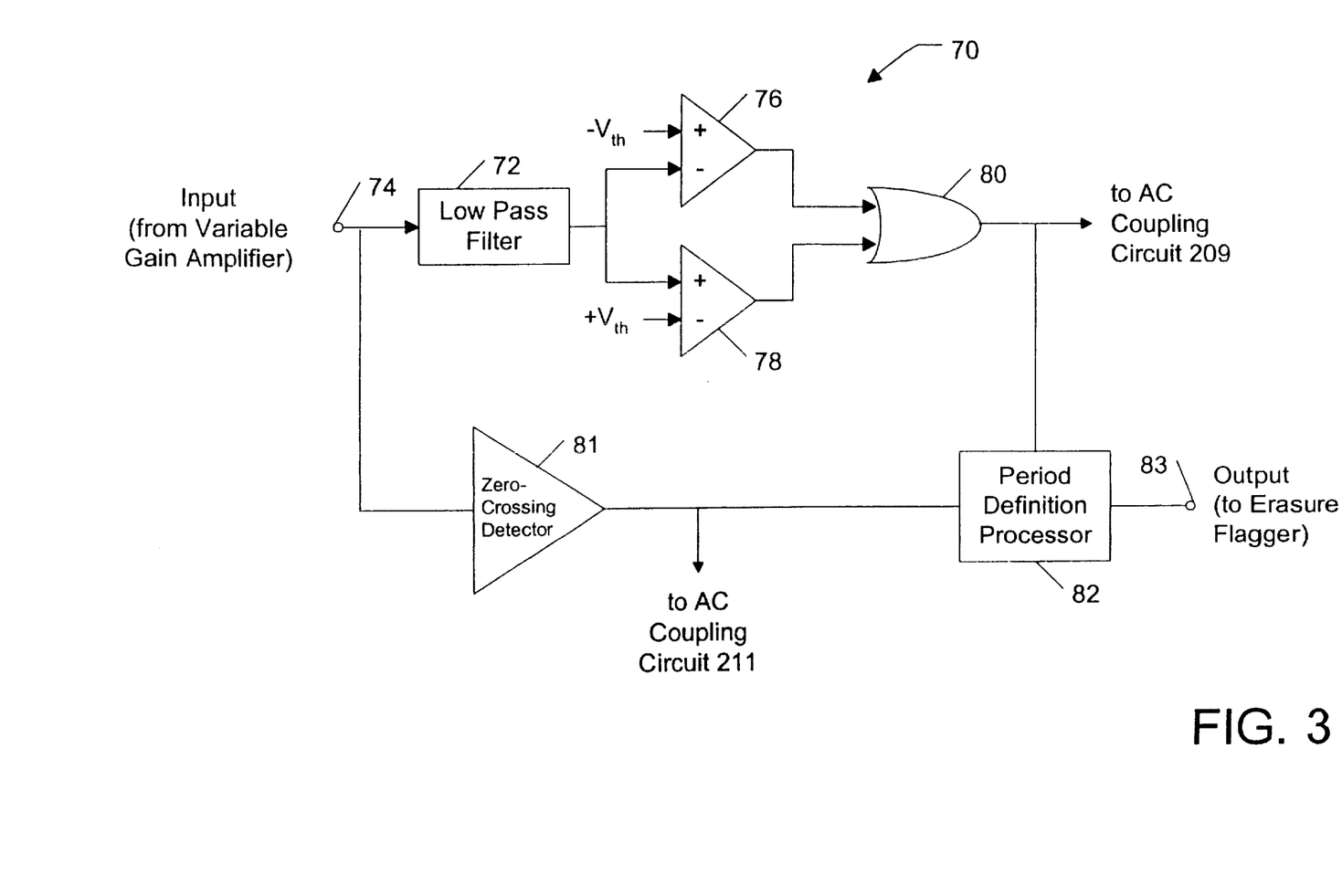
FIG. 3 is block diagram of an analog transient error detector.
Figure 4:
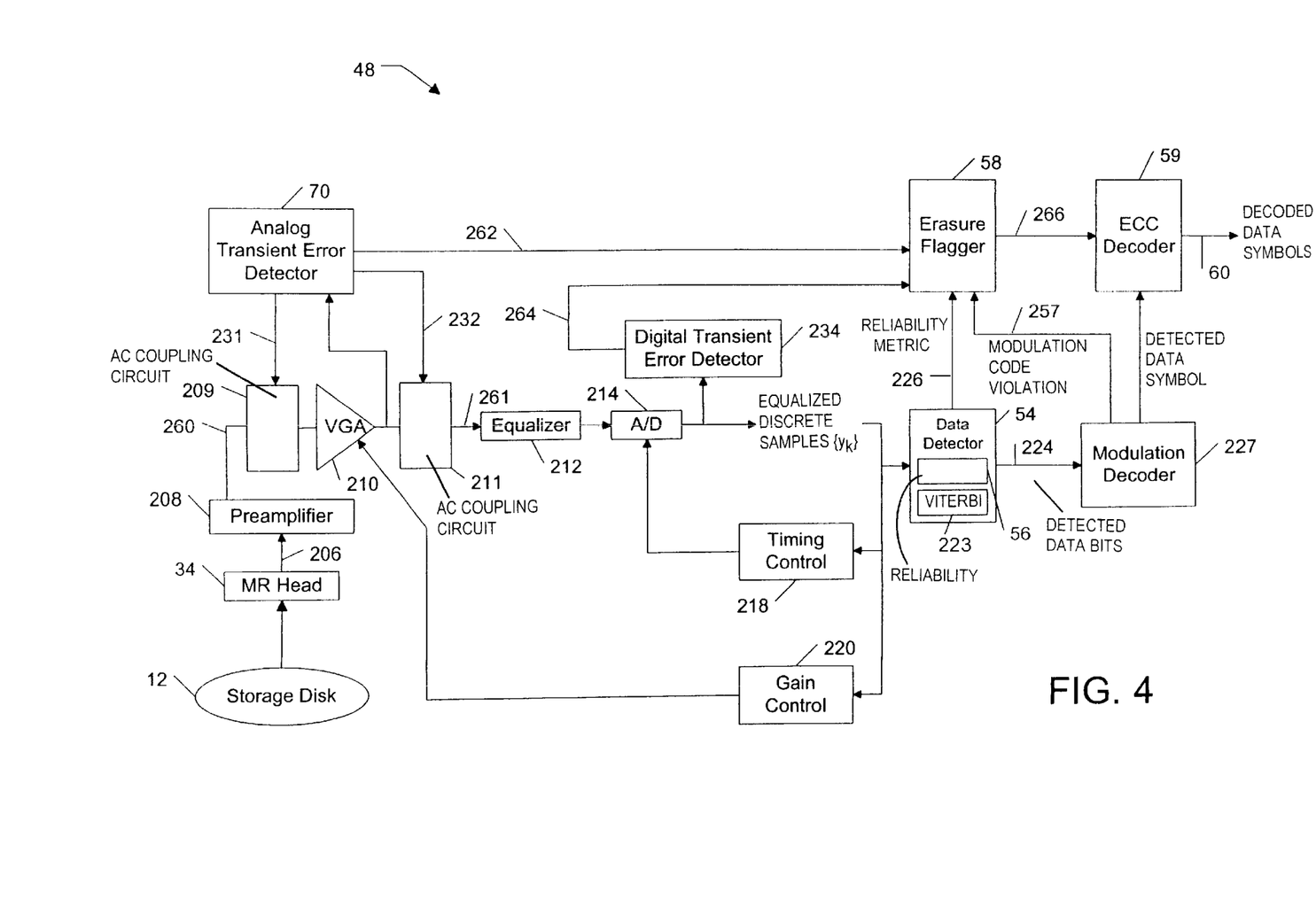
FIG. 4 is a block diagram of a read channel of a magnetic storage drive system.

Referring to FIG. 3, in one embodiment, an analog transient error detector 70 includes a low pass filter 72 with an input 74 which receives the encoded data signal from a variable gain amplifier (see, e.g., the embodiment of FIG. 4). Low pass filter 72 is configured to filter out data signals and pass transient error signals. For example, low pass filter 72 may be configured to filter out data signals with a frequency of about 2 MHZ or greater. The output of low pass filter 72 is coupled to the negative and positive terminals of comparators 76 and 78, respectively. The positive terminal of comparator 76 is coupled to a programmable negative threshold ($-V_{th}$), and the negative terminal of comparator 78 is coupled to a programmable positive threshold ($+V_{th}$). The outputs of comparators 76, 78 are combined at a logical OR gate 80 with an output 82. When a transient error occurs (e.g., as a result of a thermal asperity), the amplitude of the output signal of low pass filter 72 increases. If this amplitude exceeds $V_{th}$, one of the output signals of comparators 76, 78 will correspond to a high logic level, in which case output 82 will be at a high logic level; otherwise the output signals of both comparators will correspond to a low logic level, in which case output 82 will be at a low logic level. A threshold that tracks the envelope of the signal may be used for greater accuracy.

A starting location of a transient error may correspond to the first time the output of transient error detector 70 indicates that a transient error has been detected (e.g., switches to a high logic level). A midpoint location of a transient error may be detected by a zero-crossing detector 81 which is configured to determine when the magnitude of the data signal crosses zero for the first time after the identified starting location of a transient error. Other techniques for identifying the starting and midpoint locations, as well as other characteristics, of a transient error may be used. Analog transient error detector 230 may be used to modify the data signal to compensate for the transient error. For a TA, an attempt is made to remove the baseline shift by highpass filtering the data signal. In the embodiment of FIG. 4, the highpass filtering is accomplished by making AC coupling circuit 209, which precedes VGA 210, responsive to the detected start of a TA 231 and the time constant in AC coupling circuit 211, which follows VGA 210, responsive to the detected midpoint of a TA 232.

A period definition processor 82 has an output 83 which is coupled to erasure flagger 58. Period definition processor 82 is configured to identify different erasure periods in the data signal. For example, period definition processor 82 may identify the end of a first erasure period and the beginning of a second erasure period at an identified transient error starting location, and may identify the end of the second erasure period and the beginning of a third erasure period at a preselected number of data symbols after an identified transient error midpoint location. The preselected number of data symbols prior to the end of the second erasure period may be empirically determined.

DIGITAL TRANSIENT DETECTOR CONFIGURATION

In another embodiment, the output of equalizer 212 (FIG. 4) is digitized by an analog-to-digital (A/D) converter 214, and the input of the transient error detector is coupled to the output of the A/D converter. A digital transient error detector 234 detects the presence of a transient error by computing a moving average (MA) of the digitized samples produced at the output of the A/D converter and comparing the MA to a programmable threshold ($MA_{th}$). Digital transient error detector 234 reads data samples ($y_k$) from the output of the A/D converter. Digital transient error detector 234 computes $MA_k$ corresponding to a sample time k as follows:

$$MA_k = \frac{1}{N}\sum_{i=0}^{N-1} y_{k-i}$$

where N is the length of the moving average. An implementation with N=24 provides good performance by averaging out random noise. If the computed MA is greater than $MA_{th}$ for any sample time associated with the data symbol, the corresponding data symbol may be erased.

In one implementation, the data signal at the A/D converter input is free from any DC offset, in which case the computed MA should be small in the absence of a transient error. In this implementation, the maximum noiseless MA (in the absence of noise and transient errors) may be calculated for a data signal. The threshold value ($MA_{th}$) should be significantly higher than the maximum noiseless MA so that the transient error detector does not incorrectly treat random noise as a transient error.

Data Detector

Data detector 54 is a sampled data detection system, in which the read signal is filtered by an equalizer 212 and sampled at the channel rate of 1/T by an analog-to-digital converter 214, where T is the duration of a channel symbol. In particular, data detector 54 implements the synchronous sampling detection technique referred to as partial response maximum likelihood (PRML) signaling. In one implementation, a Viterbi detector operates upon the resulting sequence of discrete samples 216 ($Y_k$). The Viterbi detector is designed for maximum-likelihood detection of the sampled partial response read channel in additive, independent, and identically distributed Gaussian noise with zero mean. The Viterbi detector implements an iterative method of determining the "best" route along the branches of a trellis diagram. If, for each trellis branch, a metric is calculated which corresponds to the logarithm of the probability for that branch, then the Viterbi algorithm may be employed to determine the path along the trellis which accumulates the highest log probability (i.e., the "maximum likelihood" sequence).

A description of data detectors which may be used to implement the present invention may be found in Nguyen, U.S. Pat. No. 5,341,387 ("Viterbi Detector Having Adjustable Detection Thresholds For PRML Class IV Sampling Data Detection"), and in Knudson, U.S. Pat. No. 5,521,945 ("Reduced Complexity EPR4 Post-Processor For Sampled Data Detection"), both of which are incorporated herein by reference.

Although data detector 222 preferably is implemented in connection with a PRML read data channel, it also may be implemented in connection with other read channels, such as a peak detection read channel.

Reliability Detector

Reliability detector 56 computes a reliability metric for each data symbol. This information, along with information relating to the characteristics of the transient error extracted by the transient error detectors 70, 234, enables erasure flagger 58 to identify erasures based, at least in part, upon a comparison of the reliability metrics against a minimum reliability threshold. By identifying erasures with greater accuracy, the impact of transient errors on system performance may be reduced because the decoder may correct a greater number of errors in the data signal.

As explained in detail below, reliability detector 56 may increase the accuracy with which erasure flagger 58 identifies errors by calculating a reliability metric (e.g., a Viterbi path metric or a Viterbi difference metric) that is indicative of the likelihood that any one of the data bits within a data symbol is an error.

PATH METRIC

The Viterbi path metric is the accumulated squared Euclidean distance on the detected path. If the path metric accumulates distance rapidly, it may be inferred that the state transitions in the computed path are more unreliable and, consequently, the more likely it is that the corresponding data symbol is an error. Thus, in one embodiment, if the rate at which the path metric increases exceeds a minimum reliability threshold, the corresponding data symbol is labeled as an erasure. In one implementation, the path metric is stored as a binary value, and erasure flagger 58 monitors the number of cycles that one of the bits of this binary value remains unchanged; if the number of cycles is less than a preselected threshold, the data symbol preceding the threshold transition is labeled as an erasure.

The Viterbi detector may be configured to generate a path metric by minimizing the squared Euclidean distance between the sequence of noisy samples and all possible sequences of noiseless samples. As explained above, the Viterbi algorithm is an iterative algorithm for determining the minimum metric path through a trellis, where the metric in this case is the squared Euclidean distance. During each clock cycle, a Viterbi detector updates state metrics and selects one survivor path for each of the states. The survivor path represents the minimum metric path leading to a particular state, and the state metric represents the metric associated with that survivor path. In order to update the state metrics, the detector extends the survivor paths to obtain two paths to each state in the next trellis depth. A path metric is obtained by adding a state metric to a branch metric, where the branch metric represents the squared Euclidean distance between the current noisy sample and the noiseless sample associated with the branch. The path metrics associated with the two paths entering each state are compared and the minimum metric path is selected as the survivor path and the path metric for this path is selected as the new state metric.

The Viterbi path metric may be computed as described in Patapoutian et al., U.S. Pat. No. 5,661,760, which is incorporated herein by reference.

DIFFERENCE METRIC

The Viterbi difference metric is the difference between the squared Euclidean distance of the detected Viterbi path and the squared Euclidean distance of a competing Viterbi path that merges with the detected path. If the difference metric is small, it may be inferred that the corresponding data symbol is likely to be an error. Thus, in one embodiment, if the difference metric is less than a minimum reliability threshold, the corresponding data symbol is labeled as an erasure.

The Viterbi detector may be configured to generate a difference metric as described in e.g., Patapoutian et al., U.S. Pat. No. 5,661,760. The difference metric is defined as the difference between the two path metrics entering a particular state. The sign of the difference metric is equivalent to a comparison of the two path metrics.

Erasure Flagger

Erasure flagger 58 identifies erasures based, at least in part, upon a comparison of one or more of the above-described reliability metrics against one or more corresponding minimum reliability thresholds.

In one embodiment, when a transient error has been detected by analog transient error detector 70, erasure flagger 58 may define a first erasure period beginning at the start of the data block and ending at an identified transient error starting location, a second erasure period beginning at the end of the first erasure period and ending a preselected number of data symbols after an identified midpoint location, and a third erasure period beginning at the end of the second erasure period. The third erasure period may end when a second transient error is detected. Each data symbol within the first erasure period may be labeled as a valid data symbol; each data symbol within the second erasure period may be labeled as an erasure; and each data symbol within the third erasure period may be labeled as an erasure or as a valid data symbol based upon a comparison of the computed reliability metric against the minimum reliability threshold. Alternatively, each data symbol within the first erasure period may be labeled as an erasure or as a valid data symbol based upon a comparison of a first computed reliability metric against a first minimum reliability threshold, and each data symbol within the second erasure period may be labeled as an erasure or as a valid data symbol based upon a comparison of a second computed reliability metric (which is different from the first reliability metric) against a second minimum reliability threshold. Similarly, the third erasure period may use a third reliability metric and corresponding threshold. The third computed reliability metric may differ from the first and second reliability metrics. For example, the first reliability metric may be computed based upon an additive white Gaussian noise model, and the second or third reliability metric may be computed based upon the same noise model but with a different mean and variance.

Decoder

Decoder 59 corrects errors using conventional error correction decoding techniques and generates data symbols 60 from the digital data values received from data detector 54.

Detailed Read Channel Configuration

As shown in FIG. 4, partial response, sampling data magnetic read channel 48 includes rotating magnetic storage disk 12 and MR head 34. MR head 34 may be positioned by a rotary voice coil actuator operating within a closed loop servo that includes a slider and a transducer for reading information from (and writing information to) storage disk 12. In a read mode of operation, magnetic flux transitions are induced in a read element of MR head 34 and supplied over a path 206 to a read preamplifier 208. A voltage-controlled gain amplifier (VGA) 210 controllably amplifies the data signal. An equalizer 212 provides some (or all) of the equalization of the gain-normalized data signal to a predetermined spectrum (e.g., a PR4 spectrum). An analog-to-digital (A/D) converter 214 samples the data signal at the channel rate to provide discrete-time samples of the data signal. The equalized signal is then applied to control a timing control loop 218 which sets the rate and phase of the sampling within A/D converter 214. The equalized signal also is applied to a gain control loop 220 which controls VGA 210 to provide a normalized gain. The equalized signal is analyzed by data detector 54. Data detector 54 may include a Viterbi detector 223, which is configured to produce a detected data signal 224 consisting of a maximum likelihood sequence estimate of the data signal read from storage disk 12, as described in U.S. Pat. No. 5,341,387. Data detector 54 also is configured to compute a reliability metric 226 (e.g., a path metric or a difference metric), as described above. Detected data signal 224 is supplied to the input of a modulation decoder 227, which produces a first output that indicates whether a modulation code violation has occurred and a second output that corresponds to detected data symbols. The computed reliability metric signal 226 and the modulation decoder output signal are supplied to the input of erasure flagger 58. The output of erasure flagger 58 and detected data symbols from modulation decoder 227 are supplied to the input of an error correction code (ECC) decoder 59. An EPR4 post-processor as described in, e.g., Knudson, U.S. Pat. No. 5,521,954, also may be provided to reduce the complexity of read channel 200.

An analog transient error detector 230 receives the signal produced at the output of a variable gain amplifier (VGA) 210 and supplies a "1" (high logic level) to erasure flagger 228 if a low pass filter output exceeds a threshold value. If the preamplifier output is less than or equal to the threshold value, transient error detector 230 supplies a "0" (low logic level) to erasure flagger 58. A digital transient error detector 234 receives the equalized data sample at input to data detector and supplies a "1" (high logic level) to erasure flagger 58 if the computed moving average value exceeds a programmable threshold value. If the computed moving average value is less than or equal to the threshold value, transient error detector 230 supplies a "0" (low logic level) to erasure flagger 58.

Figure 5:
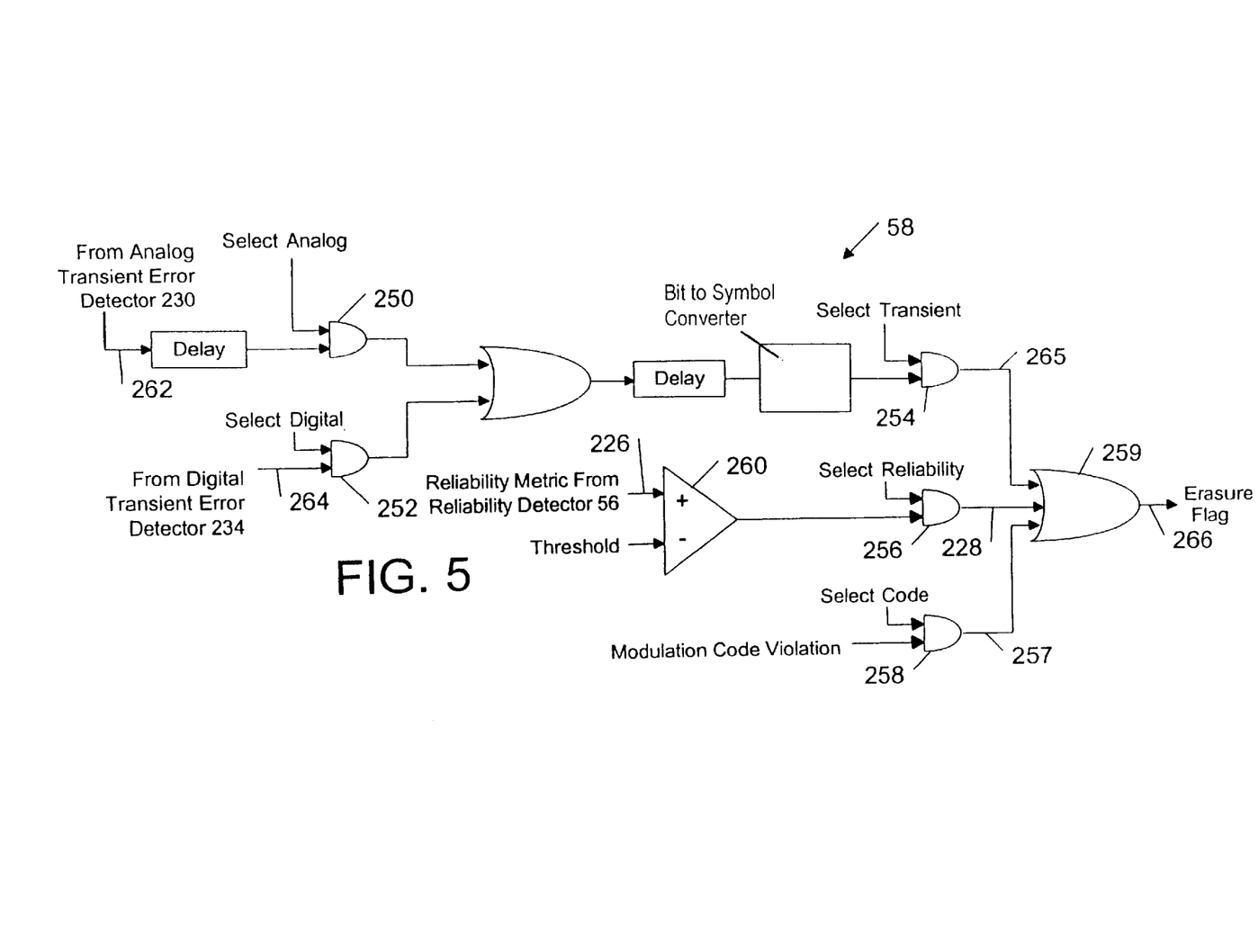
FIG. 5 is a block diagram of an erasure flagger.
Figure 6A:
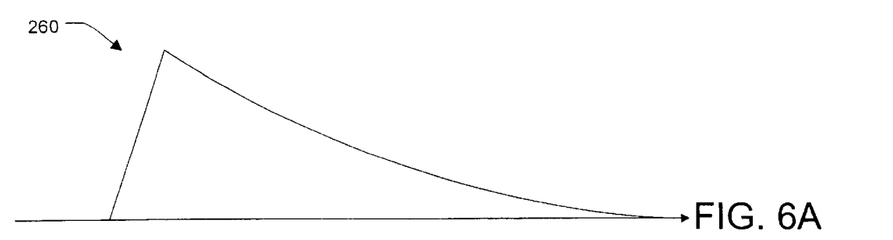
FIGS. 6A–6F are graphs of signals produced by the outputs of different components of the read channel of FIG. 4 plotted over time.
Figure 6B:
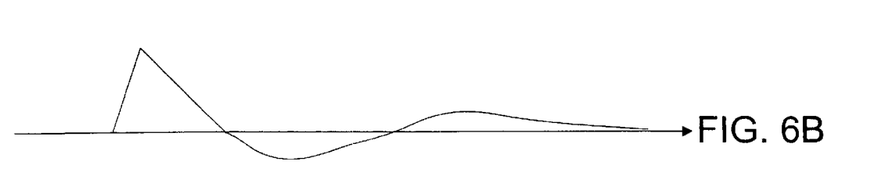
Figure 6C:
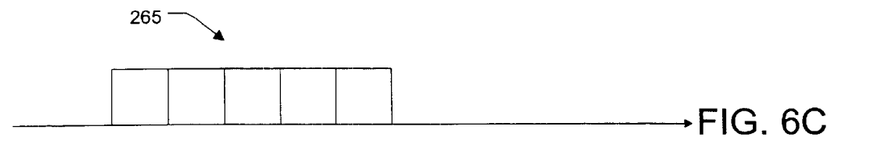
Figure 6D:
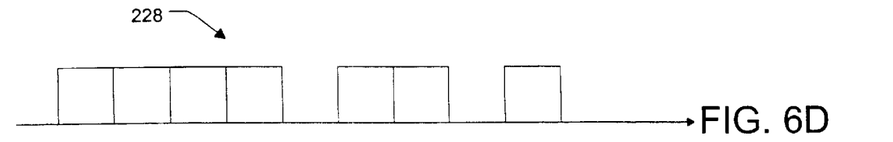
Figure 6E:
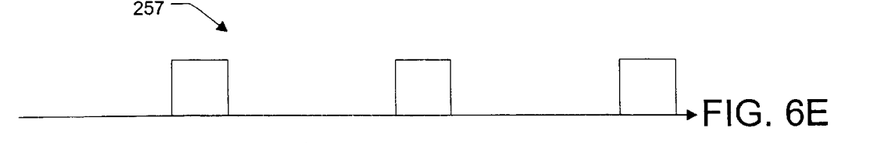
Figure 6F:
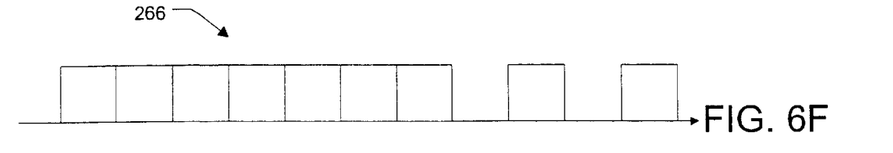

As shown in FIG. 5, in one implementation, erasure flagger 58 is configured to receive transient error information from analog transient error detector 70 and digital transient error detector 234, modulation code violation information from modulation decoder 227, and reliability metric information from reliability detector 56. AND gates 250, 252 allow erasure flagger 58 to be programmed to identify an erasure based upon the analog transient error information, the digital transient error information, both the analog and digital transient error information, or neither the analog nor digital transient error information. AND gates 254, 256, 258 allow erasure flagger 58 to be programmed to identify an erasure based upon one or more of the following: transient error information; a comparison of a computed reliability metric against a minimum reliability threshold performed by a comparator 260; and modulation code violation information received from modulation decoder 227. Based upon the information received and the programmed information selection, erasure flagger 58 outputs an erasure flag that indicates whether or not a particular data symbol should be treated as an erasure by ECC decoder 59.

Referring back to FIG. 4, ECC decoder 59 produces an error-corrected output signal 60 consisting of corrected data symbols using known error correction techniques. For example, in an implementation for only correcting errors, a Reed-Solomon ECC decoder is configured to perform four steps: 1) compute syndromes; 2) compute error-location polynomials; 3) identify error locations; and 4) compute error values. In an implementation for correcting errors and erasures, a Reed-Solomon ECC decoder is configured to perform the following additional steps: 5) modify the computed syndromes; 6) compute error-location polynomials for the modified syndromes; 7) identify error locations; and 8) compute error values and erasure values.

Referring to FIGS. 6A–6F, in operation, the incorporation of soft decision information produced by erasure flagger 58 (which is computed, at least in part, based upon reliability metric information supplied by reliability detector 56) improves the accuracy with which read channel 48 identifies erasures and, therefore, increases the number of errors that may be corrected by ECC decoder 59. For example, the transient error signal 260 produced at the output of preamplifier 208 may have the characteristic amplitude profile of FIG. 6A. After TA correction, the transient error signal produced at the output 261 of AC coupling circuit 211 may have the characteristic amplitude profile of FIG. 6B. Upon receiving transient error signal 261, transient error detectors 70, 234 generate erasure flags 265 having the profile of FIG. 6C. Reliability detector 56 produces erasure flags 228 (FIG. 6D) based upon a comparison of one or more computed reliability metrics 226 against one or more corresponding minimum reliability thresholds. Modulation decoder 227 identifies errors when the modulation code constraints are violated. The erasure flags generated by modulation decoder 227 may have the profile of FIG. 6E. As a result, the erasure signal 266 (FIG. 6F) is produced at the output of OR gate 259 of erasure flagger 58. Output signal 266 thus corresponds to the superposition of erasures identified as a result of transient error detection and reliability computation.

Other embodiments are within the scope of the claims.

What is claimed is:

1. A method of reading a data signal representing one or more encoded data symbols subject to random errors and transient errors, comprising:

identifying one or more characteristics of a transient error in the data signal;

computing a reliability metric for one or more data symbols;

labeling one or more of the data symbols as erasures or as valid data symbols based upon the identified transient error characteristic and a comparison of the computed reliability metric against a minimum reliability threshold; and producing corrected data symbols by correcting errors and erasures.

2. The method of claim 1, wherein an identified transient error characteristic corresponds to a starting location of the transient error, and further comprising labeling as erasures a number of consecutive data symbols beginning at the identified starting location of the transient error.

3. The method of claim 1, further comprising defining a first erasure period beginning with a first data symbol and ending at an identified transient error starting location, and a second erasure period beginning at the identified transient error starting location and ending a number of consecutive data symbols after an identified midpoint location of the transient error.

4. The method of claim 3, wherein each data symbol within the first erasure period is labeled as a valid data symbol and each data symbol within the second erasure period is labeled as an erasure.

5. The method of claim 3, wherein each data symbol within the first erasure period is labeled as an erasure or as a valid data symbol based upon a comparison of a first computed reliability metric against a first minimum reliability threshold, and each data symbol within the second erasure period is labeled as an erasure or as a valid data symbol based upon a comparison of a second computed reliability metric against a second minimum reliability threshold.

6. The method of claim 5, wherein the first and second reliability metrics are different.

7. The method of claim 5, wherein the first and second minimum reliability thresholds are different.

8. The method of claim 5, further comprising defining a third erasure period beginning at the end of the second erasure period, wherein each data symbol within the third erasure period is labeled as an erasure or as a valid data symbol based upon a comparison of a third computed reliability metric against a third minimum reliability threshold.

9. The method of claim 8, wherein the third reliability metric is different from the first and second reliability metrics.

10. The method of claim 1, wherein the reliability metric that is computed is based upon a Viterbi difference metric.

11. The method of claim 10, wherein a data symbol is labeled as an erasure when the computed Viterbi difference metric is less than the minimum reliability threshold for any time associated with the data symbol.

12. The method of claim 1, wherein the reliability metric that is computed is a Viterbi path metric.

13. The method of claim 12, wherein a data symbol is labeled as an erasure when the Viterbi path metric accumulated over the data symbol exceeds the minimum reliability threshold.

14. The method of claim 1, further comprising labeling one or more of the data symbols as erasures or as valid data symbols based upon a modulation code verification.

15. A system for reading a data signal representing one or more encoded data symbols and subject to random errors and transient errors, comprising:

a transient error detector coupled to receive the encoded data symbol and configured to identify one or more characteristics of a transient error in the data signal;

a reliability detector configured to compute a reliability metric for one or more of the data symbols;

an erasure flagger configured to label one or more of the data symbols as erasures or as valid data symbols based upon the identified transient error characteristic and a comparison of the computed reliability metric against a minimum reliability threshold; and a decoder coupled to the erasure flagger and configured to produce corrected data symbols by correcting errors and erasures.

16. The system of claim 15, wherein the transient error detector is configured to identify a characteristic of a transient error caused by a thermal asperity.

17. The system of claim 15, wherein the transient error detector is configured to identify a characteristic of a transient error caused by a drop-out or a defect.

18. The system of claim 15, wherein the reliability detector is a soft-output Viterbi detector.

19. The system of claim 18, wherein the reliability detector is configured to compute a Viterbi difference metric for each bit in a data symbol and assigns to the data symbol a reliability metric corresponding to the lowest computed Viterbi difference metric.

20. The system of claim 19, wherein the erasure flagger labels the data symbol as an erasure when the assigned Viterbi difference metric is less than the minimum reliability threshold.

21. The system of claim 18, wherein the reliability detector is configured to compute a Viterbi path metric accumulated over a data symbol.

22. The system of claim 21, wherein the erasure flagger labels the data symbol as an erasure when the computed Viterbi path metric accumulated over the data symbol exceeds the minimum reliability threshold.

23. A magnetic disk storage system, comprising:

at least one magnetic storage disk;

at least one magnetoresistive (MR) head configured to extract from the at least one magnetic storage disk a data signal representing one or more encoded data symbols and subject to random errors and transient errors; and a transient error detector coupled to receive the encoded data symbol and configured to identify one or more characteristics of a transient error in the data signal;

a reliability detector configured to compute a reliability metric for one or more of the data symbols;

an erasure flagger configured to label one or more of the data symbols as erasures or as valid data symbols based upon the identified transient error characteristic and a comparison of the computed reliability metric against a minimum reliability threshold; and a decoder coupled to the erasure flagger and configured to produce corrected data symbols by correcting errors and erasures.

24. The system of claim 23, wherein the reliability detector is a soft-output Viterbi detector.

25. The system of claim 24, wherein the Viterbi detector is configured to compute a Viterbi difference metric for each bit in a data symbol and assigns to the data symbol a reliability metric corresponding to the lowest computed Viterbi difference metric, and the erasure flagger labels the data symbol as an erasure when the assigned Viterbi difference metric is less than the minimum reliability threshold.

26. The system of claim 24, wherein the Viterbi detector is configured to compute a Viterbi path metric for a data symbol, and the erasure flagger labels the data symbol as an erasure when the computed Viterbi path metric accumulated over the data symbol exceeds the minimum reliability threshold.

* * * * *

UNITED STATES PATENT AND TRADEMARK OFFICE
CERTIFICATE OF CORRECTION

PATENT NO. : 6,446,236 B1
DATED : September 3, 2002
INVENTOR(S) : Kelly Fitzpatrick, Peter McEwen and Hossein Sedarat It is certified that error appears in the above-identified patent and that said Letters Patent is hereby corrected as shown below:

<u>Title page,</u>
Item [57], ABSTRACT,
Line 3, after "transient errors" insert -- is described --.

<u>Column 4,</u>
Line 62, replace "5,521,954" with -- 5,521,945 --.

<u>Column 5,</u>
Line 8, replace "2.5" with -- 2-5 --.

<u>Column 9,</u>
Line 26, replace "5,521,954" should read -- 5,521,945 --.

Signed and Sealed this

First Day of April, 2003

JAMES E. ROGAN
*Director of the United States Patent and Trademark Office*